United States Patent [19]

Suzuki et al.

[11] Patent Number: 5,032,055

[45] Date of Patent: Jul. 16, 1991

[54] CARRIER RECEIVING DEVICE FOR BONDING MACHINES

[75] Inventors: Yasunobu Suzuki; Iwao Takahashi, both of Tokyo, Japan

[73] Assignee: Kabushiki Kaisha Shinkawa, Tokyo, Japan

[21] Appl. No.: 379,324

[22] Filed: Jul. 12, 1989

[30] Foreign Application Priority Data

Aug. 31, 1988 [JP] Japan ................................ 63-217227

[51] Int. Cl.$^5$ ............................................. B65G 57/30
[52] U.S. Cl. ................................. 414/795.3; 221/293; 414/798.1
[58] Field of Search ...................... 221/289, 293; 414/795.3, 798, 798.1, 933

[56] References Cited

U.S. PATENT DOCUMENTS

| | | | |
|---|---|---|---|
| 548,056 | 10/1895 | Hewitt | 414/929 X |
| 1,330,639 | 2/1920 | Leumann | 221/293 X |
| 4,359,305 | 11/1982 | Young et al. | 414/795.3 X |
| 4,671,722 | 6/1987 | Ray et al. | 414/795.3 X |
| 4,684,308 | 8/1987 | Dorner | 414/795.3 |
| 4,809,881 | 3/1989 | Becker | 414/798.1 X |

FOREIGN PATENT DOCUMENTS 254423 11/1986 Japan ................................ 414/795.3

Primary Examiner—F. J. Bartuska
Assistant Examiner—Janice Krizek
Attorney, Agent, or Firm—Koda and Androlia

[57] ABSTRACT

Supplying and receiving devices for carriers, which carry substrates for semiconductors thereon, including a pair of carrier guides with an open space; carrier holding claws pivotally provided on the carrier guides so that the claws can hold a carrier; a carrier lifter which moves up and down between the carrier guides; and claw opening pieces provided on the carrier lifter. In the carrier supplying device, the carrier lifter moves up and when the claw opening pieces come into contact with the claws and open the claws. The lowermost carrier accommodated in the carrier guides is then released from the claws and placed on the carrier lifter so that the carrier is taken out of the carrier guides and the carrier immediately above the released carrier is held by the claws. In the receiving device, the claw opening pieces move upward along with the carrier lifter with a carrier thereon and when the claw opening pieces come into contact with the claws, the claws are opened and the carrier on the lifter is held by the claws so that the carrier is placed in the carrier guides.

1 Claim, 5 Drawing Sheets

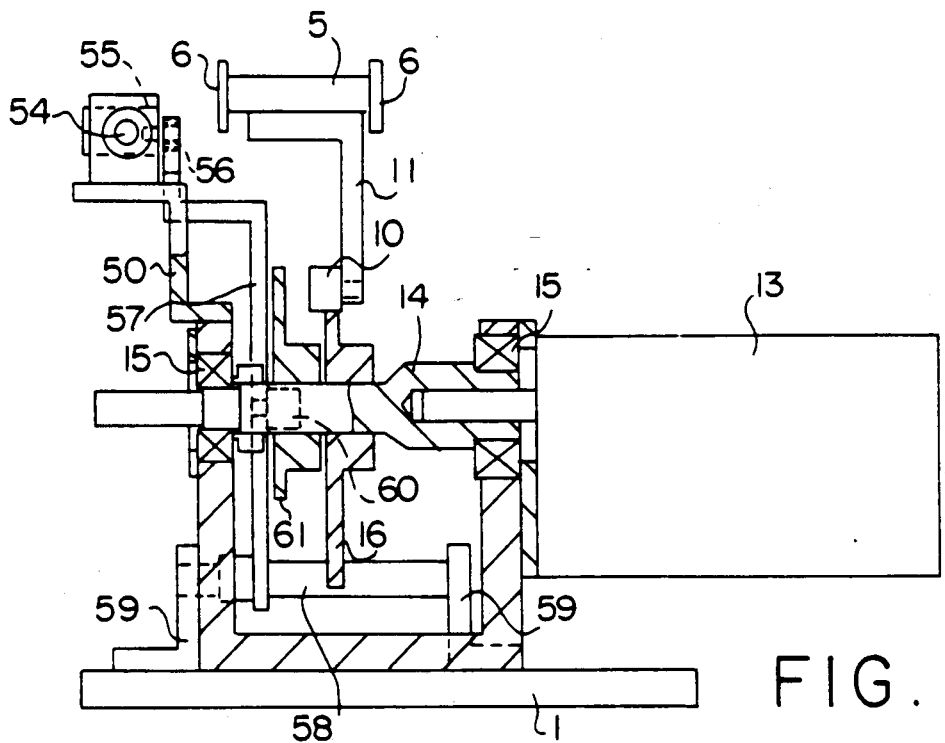
FIG. 4
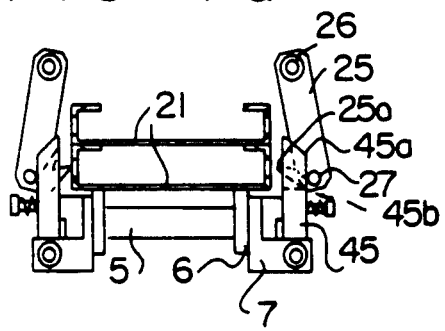
FIG. 7a
FIG. 7c
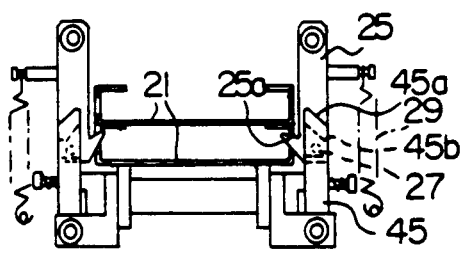
FIG. 7b
FIG. 7d

CARRIER RECEIVING DEVICE FOR BONDING MACHINES

BACKGROUND OF THE INVENTION

1. Field of the Invention

The present invention relates to a supplying device which extracts carriers (carrying substrates) one at a time from a magazine and to a receiving device which inserts the carriers into the magazine one at a time.

2. Prior Art

In the prior art, die bonders and wire bonders (used to assemble semiconductor devices) utilize carriers which carry a multiple number of substrates positioned at equal intervals to send the substrates to a bonding area where processing is performed. Supplying devices, which supply carriers to the bonding area, and receiving devices, which accommodate the carriers (along with the substrates carried in the carriers) after processing has been completed in the bonding area, generally utilize magazines to hold the carrier in a stacked arrangement.

Conventional magazines have numerous guide grooves (into which the edges of the carriers are inserted) formed at regular intervals on the interior facing side walls so as to facilitate extraction and insertion of the carriers. Accordingly, in conventional supplying devices or receiving devices, the magazine is raised and lowered in steps corresponding to the pitch of the guide grooves. The carriers are then extracted or inserted along the guide grooves, thus facilitating extraction or insertion of the carriers.

However, since the above described conventional devices use magazines having guide grooves, a new magazine with a guide groove pitch corresponding to the height of the carriers must be used whenever the height of the carriers is changed. Accordingly, it is necessary to have an extremely large number of different types of magazines. Furthermore, the guide groove pitch of each magazine must be set so that a gap is left between adjacent carriers in the stack and accordingly, the number of carriers that can be held in the magazine is reduced.

SUMMARY OF THE INVENTION

To overcome the disadvantages found in prior art devices, it is an object of the present invention to provide a supplying device and a receiving device which can easily be used with carriers of different heights and which can accommodate an extremely large number of carriers.

This object of the present invention is achieved by means of a device which is equipped with carrier guide means installed facing each other across a gap which is slightly wider than the width of the carriers, the bottom of the gap being open; claw means which are installed facing each other and which are free to rotate on the carrier guide means and which support the lowermost carrier accommodated inside the carrier guide means; a carrier lifting means which is driven vertically between the carrier guide means from a point below the carrier guide means; and a claw opening and closing means which is installed on the carrier lifting means and which opens and closes the claw means by a vertical motion.

The claw opening and closing means of the carrier supplying device is installed on the carrier lifting means, and is constructed so that it rises together with the carrier lifting means and opens the claw means so that a specified carrier accommodated inside the carrier guide means is placed on the carrier lifting means. The claw opening and closing means further causes the carrier immediately above the carrier placed on the carrier lifting means (i.e., the next carrier up) to be held by the claw means when the carrier lifting means is lowered.

Furthermore, the claw opening and closing means of the carrier receiving device is installed on the carrier lifting means, and is constructed so that the claw opening and closing means rises together with the carrier lifting means and opens the claw means so that a specified carrier carried on the carrier lifting means is positioned inside the carrier guide means, and the claw opening and closing means causes the carrier carried on the carrier lifting means to be held by the claw means when the carrier lifting means is lowered.

Thus, in the supplying device of the present invention the carriers may be extracted one at a time in the following manner. That is, the carrier lifting means and claw opening and closing means rise together so that the claw means are opened by the carrier lifting means and the lowermost carrier held by the claw means is placed on the carrier lifting means. Afterward, when the carrier lifting means and claw opening and closing means are lowered, the next carrier above the lowermost carrier is held by the claw means to extract it.

Furthermore, the receiving device of the present invention allows carriers to be received in the following manner. That is, the carrier lifting means on which a carrier is placed rises, and the claw means are opened by the claw opening and closing means. When the carrier on the carrier lifting means is positioned in the area of the claws of the claw means, the claw means are closed so that the carrier is held by the claws. Afterward, the carrier lifting means and the claw opening and closing means are lowered.

Thus, carriers can be stacked and accommodated in the carrier guide means which forms a magazine. As a result, a large number of carriers can be accommodated and if there is a change in the height of the carriers, one must only merely alter the claw opening and closing means.

BRIEF DESCRIPTION OF THE DRAWINGS

FIG. 4 is a cross-sectional view taken along the line IV—IV of FIG. 1;

FIGS. 7(a)–7(d) are explanatory diagrams which illustrate the carrier receiving operation of the receiving device of the present invention.

DETAILED DESCRIPTION OF THE INVENTION

Figure 1:
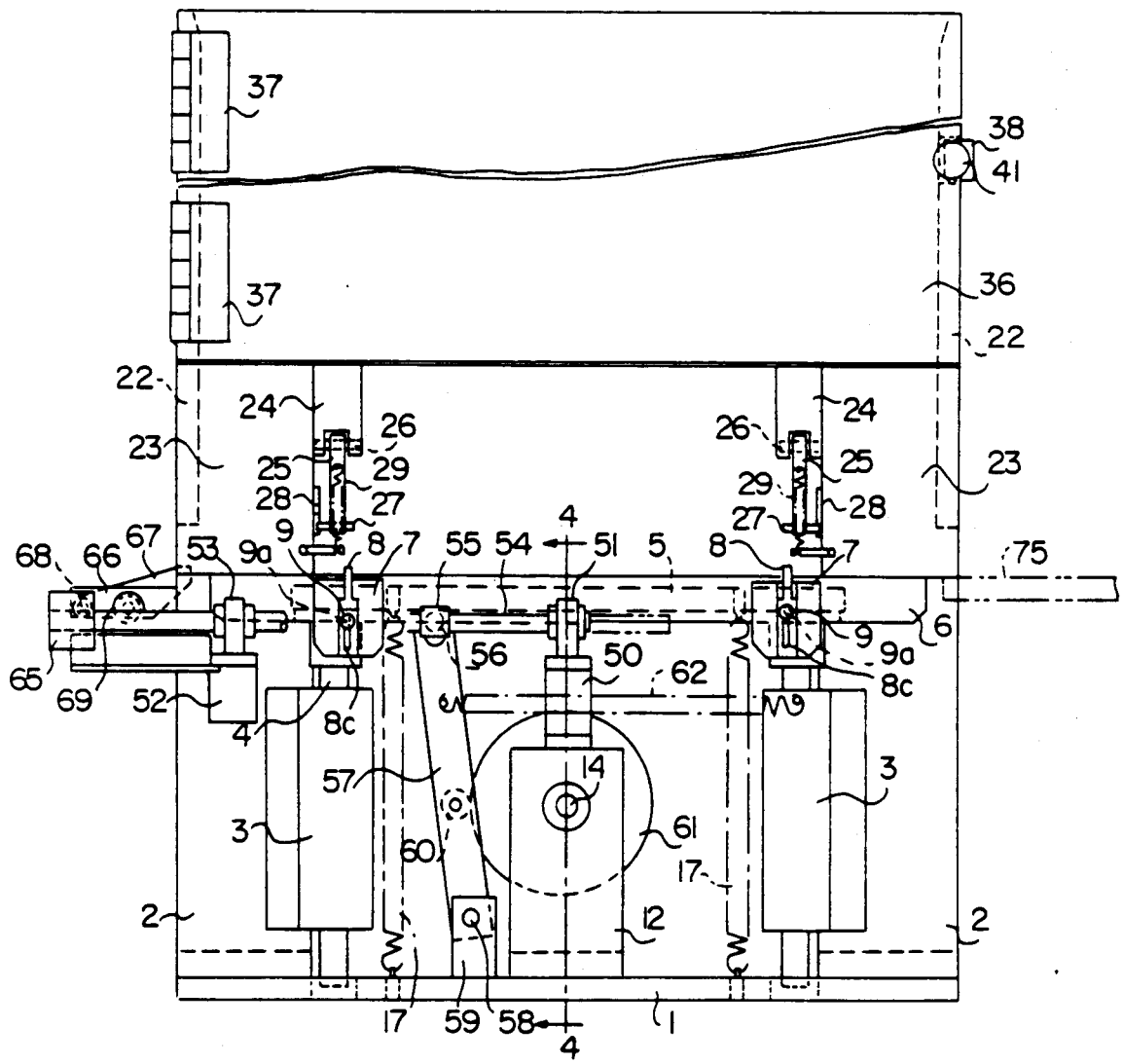
FIG. 1 is a front view which illustrates the supplying device of the present invention.
Figure 2:
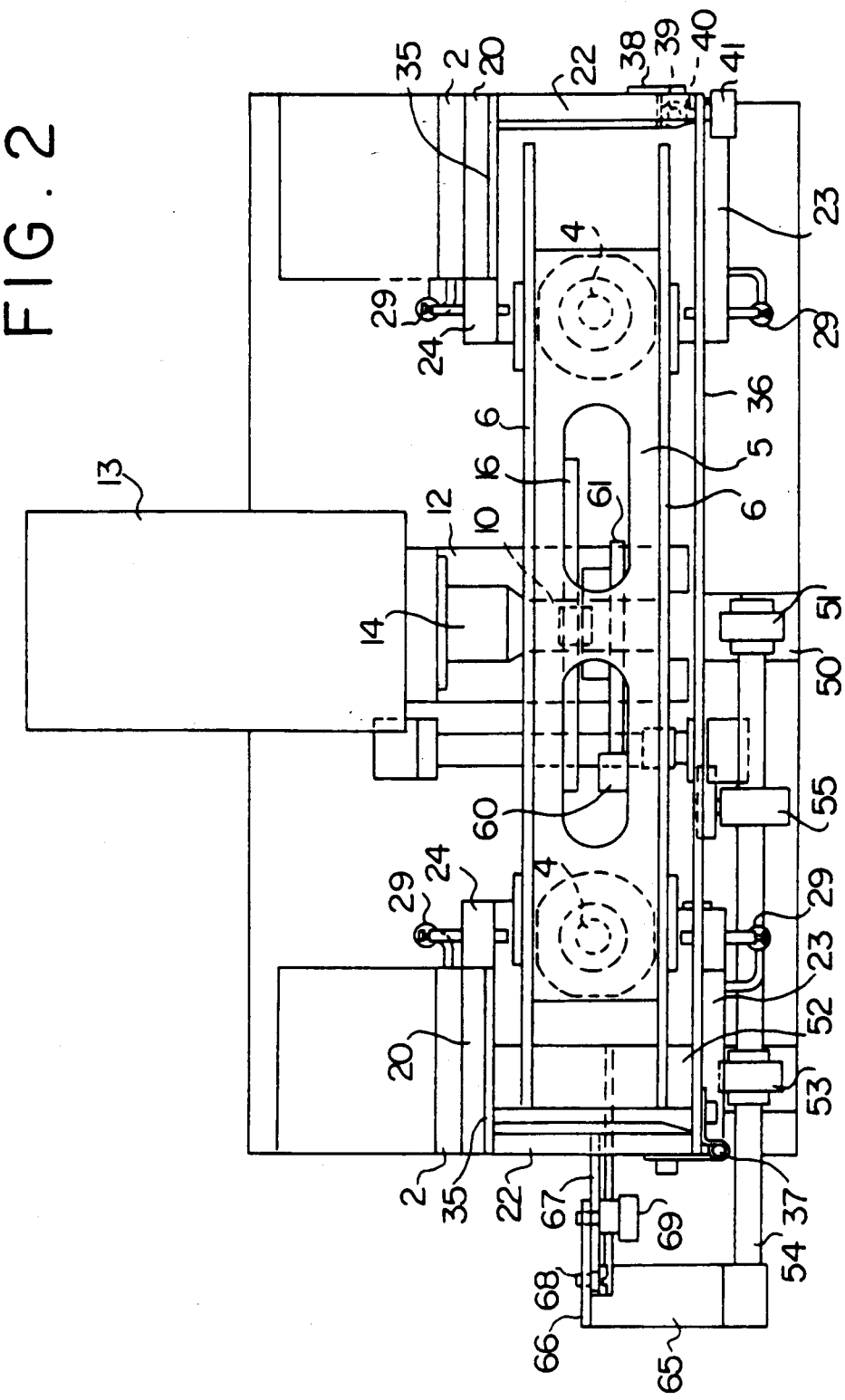
FIG. 2 is a plan view of the device shown in FIG. 1.
Figure 3:
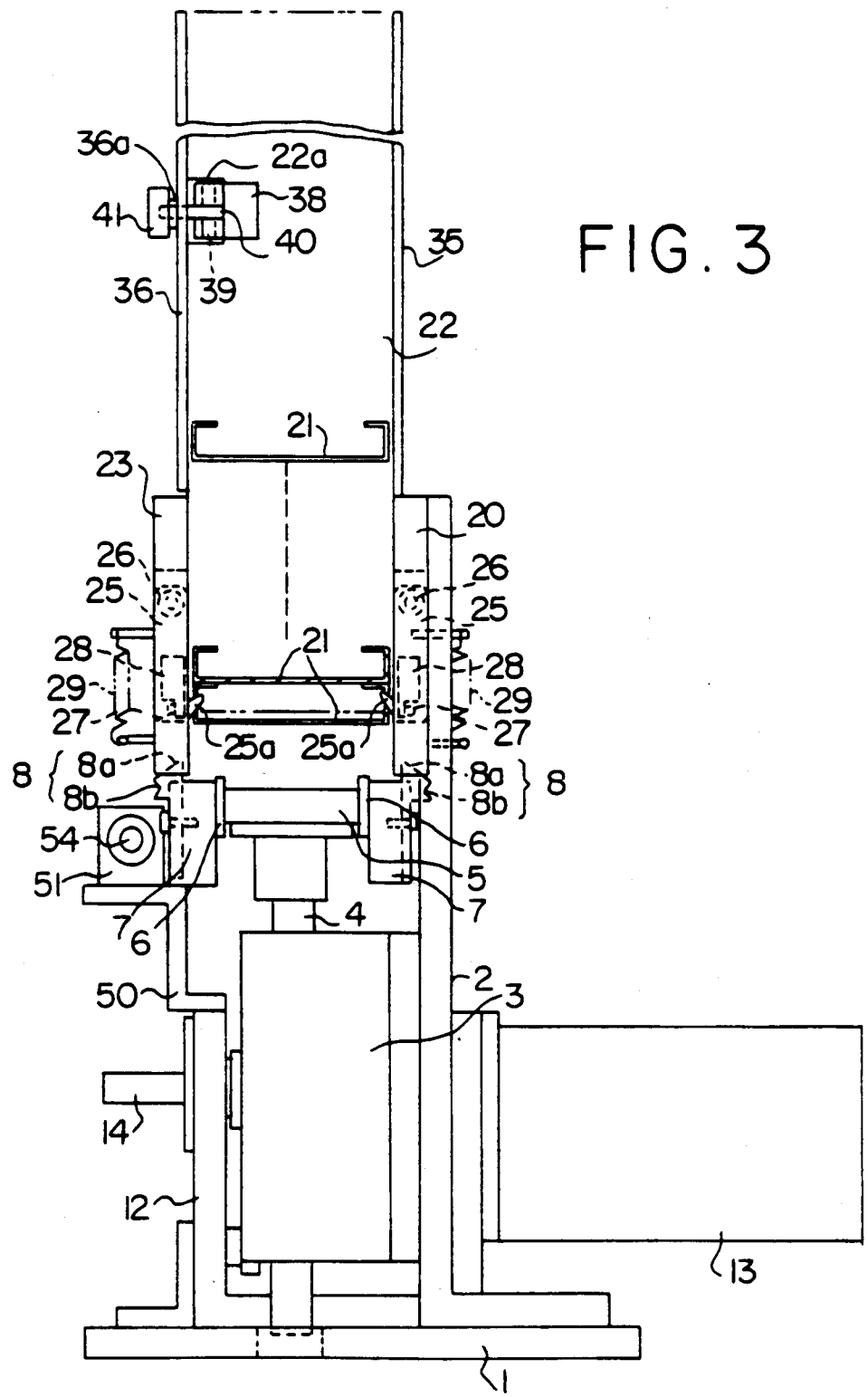
FIG. 3 is a right-side view of the device shown in FIG. 1.

A detailed description of the present invention will be given below with reference to the accompanying drawings wherein like reference numerals denote like elements.

Since both the supplying device and the receiving device of the present invention have roughly the same structure, parts which are common to both devices (that is, which are similar in structure in both devices) will be described first in terms of the supplying device with reference to FIGS. 1, 2, 3, 4 and 5(a)–5(d).

Supporting plates 2 are respectively fastened to a base plate 1 on the left and right sides of the base plate 1. Bearing holders 3 are fastened to these supporting plates 2. Vertically moving rods 4 are installed in these bearing holders 3 so that the rods 4 are free to move upward and downward. A carrier lifting support plate 5 is fastened to the upper surfaces of the vertically moving rods 4. Carrier lifting plates 6 are fastened to both sides of this carrier lifting support plate 5, and claw opening and closing support plates 7 are fastened to the outside surfaces of these carrier lifting plates 6. Claw opening and closing plates 8 are installed on the claw opening and closing support plates 7 so that the claw opening and closing plates 8 are free to slide upward and downward. These claw opening and closing plates 8 each have a tapered surface 8a which is inclined downward toward the outside, and a V-shaped groove 8b which is located below the tapered surface 8a. Furthermore, a slot 8c is formed in each of the claw opening and closing plates 8 in order to restrict the range of upward and downward movement of the claw opening and closing plates 8. The shaft 9a of a screw 9 which is fastened to the corresponding claw opening and closing support plate 7 is inserted into the slot 8c of each claw opening and closing plate 8. Furthermore, a cam follower support plate 11 on the lower end of which a cam follower 10 (see FIG. 4) is supported so that the cam follower 10 is free to rotate is fastened to the central part of the undersurface of the carrier lifting support plate 5.

A U-shaped motor support plate 12 is fastened between the supporting plates 2 and a motor 13 is fastened to this motor support 12. Furthermore, a cam shaft 14 which is fastened to the motor 13 is supported on the motor support plate 12 via bearings 15 so that the cam shaft 14 is free to rotate. A carrier lifting cam 16 is fastened to the cam shaft 14, and the cam follower 10 is in contact with this carrier lifting cam 16. Furthermore, the carrier lifting support plate 5 is driven downward by a spring 17 so that the cam follower 10 is pressed against the carrier lifting cam 16.

Carrier guide plates 20 are fastened to the upper portions of the sides of the supporting plates 2. Other carrier guide plates 23 are fastened to the carrier guide plates 20 via supporting plates 22 which are slightly longer than the width of the carrier 21, so that the carrier guide plates 23 face the carrier guide plates 20. A claw support plate 24 is fastened to the side surface (end surface) of each of the carrier guide plates 20 and 23. A claw lever 25 is supported on each of these claw support plates 24 via a pin 26 so that the claw lever 25 is free to rotate. These claw levers 25 have claw parts 25a which project into the space between the facing carrier guide plates 20 and 23. These claw parts 25a are arranged so that they engage with holes which are formed in the side surfaces of each carrier 21.

Pins 27 are installed in the claw levers 25 so that the pins 27 project in positions corresponding to the positions of the tapered surfaces 8a of the claw opening and closing plates 8. Furthermore, in order to regulate the amount by which the claw parts 25a project inward, stopper plates 28 which are contacted by the pins 27 are fastened to the carrier guide plates 20 and 23. The claw levers 25 are driven by springs 29 so that the pins 27 are pressed against the stopper plates 28.

A carrier guide plate 35 is fastened to the supporting plates 22 above the carrier guide plates 20. Furthermore, one end of an opening and closing cover 36 which doubles as a carrier guide is fastened by means of hinges 37 to one of the supporting plates 22 above the carrier guide plates 23 so that the cover 36 can be freely opened and closed. A cut-out area 22a is formed in a portion of the supporting plate 22 located at the opening and closing end of the opening and closing cover 36 and a lock support plate 38 is fastened in place in this cut-out area 22a. A pin 39 is fastened to lock the support plate 38 in a vertical position, and a locking bolt 40 which has screw threads formed at one end is supported on the pin 39 so that the locking bolt 40 is free to rotate. A cut-out area 36a is formed in the opening and closing cover 36 so that the locking bolt 40 can enter the cut-out area 36a from the side. Furthermore, a locking nut 41 is tightened down on the screw threads of the locking bolt 40.

Accordingly, the opening and closing cover 30 can be opened by loosening the locking nut 41 and moving the locking bolt 40 through the cut-out area 36a until the bolt 40 reaches the outside. In this way, carriers 21 can be inserted into or removed from the device.

The receiving device of the present invention has roughly the same structure as that described above. The main differences are described as follows.

Figure 6A:
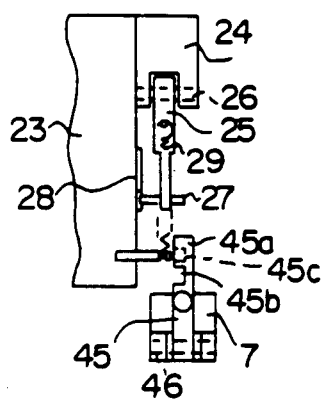
FIG. 6(a) is a front view of the receiving device of the present invention.
Figure 6B:
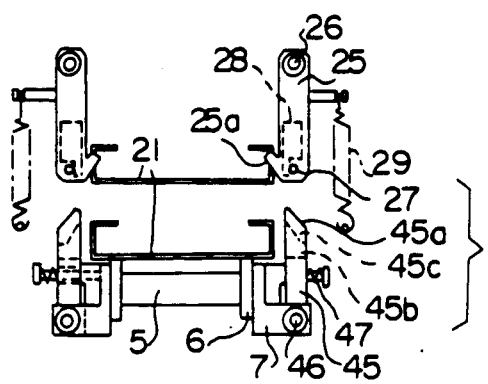
FIG. 6(b) is a side view of the receiving device of the present invention.

In the supplying device, the claw opening and closing plates 8 are installed on the claw opening and closing support plates 7 so that the claw opening and closing plates 8 are free to slide upward and downward. In the receiving device, the claw opening and closing plates 45 are supported on the claw opening and support plates 7 via pins 46 so that the claw opening and closing plates 45 are free to rotate (as shown in FIG. 6(b)). Furthermore, these claw opening and closing plates 45 are driven inward by springs 47. In addition, tapered surfaces 45a for the purpose of opening the claw levers 25 outward by acting on the pins 27 are formed on the upper surfaces of the claw opening and closing plates 45, and grooves 45b into which the pins 27 enter are formed in the claw opening and closing plates 45 a fixed distance below the tapered surfaces 45a. Furthermore, tapered surfaces 45c for the purpose of opening the claw opening and closing plates 45 outwardly are formed in the upper surfaces of the grooves 45b.

A pusher mechanism which is required in the supply device only will be described next with reference to FIGS. 1–4.

In the pusher mechanism, a bearing 51 is fastened to the motor support plate 12 via a supporting plate 50. Furthermore, a bearing 53 is also fastened to the left-side carrier guide plate 20 via a supporting plate 52. A horizontal rod 54 is installed in the bearings 51 and 53 so that the horizontal rod 54 is free to slide to the left and right (see FIGS. 1 and 2). A bridge 55 is fastened to an intermediate part of the horizontal rod 54, and a roller 56 is supported on this bridge 55 so that the roller 56 is free to rotate. A groove which is formed in the upper end of the lever 57 engages with the roller 56, and the lower end of this lever 57 is fastened to a shaft 58. Both ends of this shaft 58 are supported by supporting plates 59 which are fastened to the base plate 1. The shaft 58 is supported so that it is free to rotate. Furthermore, a cam follower 60 is supported at an intermediate point on the lever 57 so that the cam follower 60 is free to rotate. A pusher cam 61 is fastened to the cam shaft 14 in a position corresponding to the position of the cam follower 60. The lever 57 is driven by a spring 62 so that the cam follower 60 is pushed against the pusher cam 61.

A supporting plate 65 is fastened to the left end of the horizontal rod 54, and a pusher support plate 66 is fastened to this supporting plate 65 so that the pusher support plate 66 is positioned at the left end of the device, roughly midway between the carrier lifting plates 6. One end of the pusher plate 67 is supported on this pusher support plate 66 via a pin 68 so that the pusher plate 67 is free to rotate. Furthermore, a stopper 69 is fastened to the pusher plate 66 and the pusher plate 67 rests on this stopper 69 so that the pusher plate 67 is prevented from being lowered.

Operation of the present invention will be described in the following paragraphs.

When the motor 13 turns, the carrier lifting cam 16 and pusher cam 61 are rotated by the cam shaft 14. First, the carrier lifting plates 6, claw opening and closing support plates 7 and claw opening and closing plates 8 are caused to rise from the positions illustrated in FIG. 5(a) to the positions illustrated in FIG. 5(b) by the ascending profile of the carrier lifting cam 16 via the cam follower 10, a cam follower support plate 11 and carrier lifting support plate 5, so that the pins 27 enter the V-shaped grooves 8b formed in the claw opening and closing plates 8. During this rising process, the pins 27 are pushed outward by the tapered surfaces 8a of the claw opening and closing plates 8, so that the claw parts 25a of the claw levers 25 are removed from the carrier 21 with which the claw parts 25a have been engaged. As a result, this carrier 21 is set on the carrier lifting plates 6.

Figure 5A:
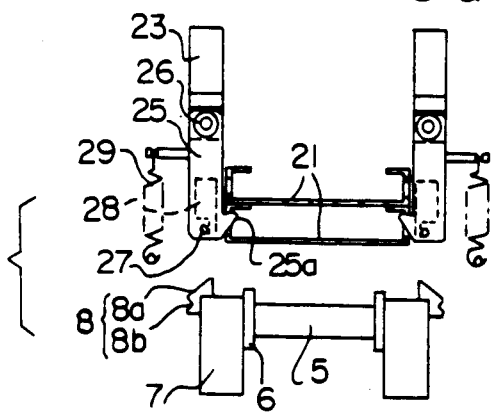
FIGS. 5(a)–5(d) are explanatory diagrams which illustrate the carrier extraction operation of the supplying device of the present invention.
Figure 5B:
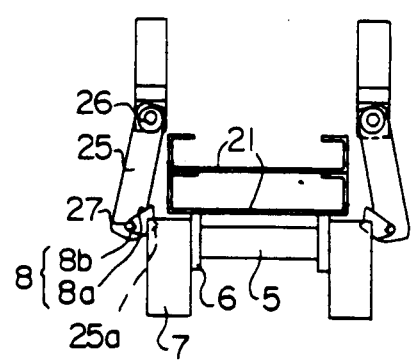
Figure 5C:
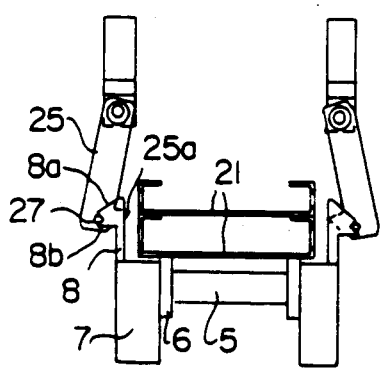
Figure 5D:
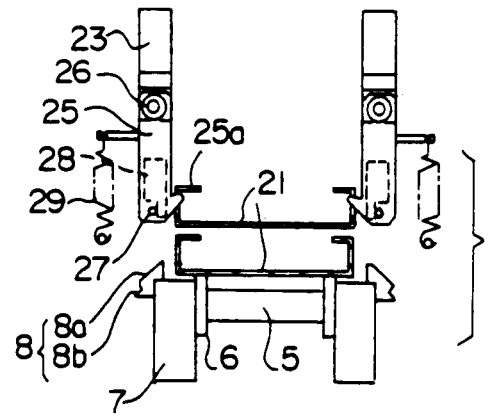

Next, the carrier lifting plates 6 are lowered in accordance with the descending profile of the carrier lifting cam 16 (as shown in FIGS. 5(c) and 5(d)). In this case, the claw opening and closing plates 8 can move vertically within the range determined by the slots 8c. Accordingly, when lowering of the claw opening and closing plates 8 is stopped by the pins 27, the carrier lifting support plate 5, carrier lifting plates 6 and claw opening and closing support plates 7 continue to move downward as shown in FIG. 5(c). When the lower ends of the slots 8c in the claw opening and closing plates 8 contact the shafts 9a of the screws 9, the lowermost carrier 21 in the device is positioned below the tips of the claw parts 25a. Afterward, the claw opening and closing plates 8 are lowered along with the claw opening and closing support plates 7. As a result, the pins 27 are disengaged from the V-shaped grooves 8b, and the claw levers 25 are caused to close inward by the force of the springs 29. Accordingly, as is shown in FIG. 5(d), the second carrier 21 from the bottom is held by the claw parts 25a, while the lowermost carrier 21 is positioned on the carrier lifting plates 6.

The lever 57 is then caused to rotate in a clockwise direction (with reference to FIG. 1) by the descending profile of the pusher cam 61 and is then caused to rotate counterclockwise by the ascending profile of the pusher cam 61. When the lever 57 rotates clockwise, the horizontal rod 54, supporting plate 65, pusher support plate 66 and pusher plate 67 move to the right (with reference to FIG. 1). As a result, the carrier 21 which has been placed on the carrier lifting plates 6 (as described above) is pushed out onto a conveyor path 75 by the pusher plate 67. Via this action, one supply cycle is completed.

The receiving device will now be described with reference to FIGS. 6 and 7.

When a carrier 21 carrying substrates whose processing has been completed is fed onto the carrier lifting plates 6 from the conveyor path 75 and stops on the carrier lifting plates 6, the motor 13 turns so that the carrier lifting support plate 5 and carrier lifting plates 6 move vertically. First, the carrier lifting support plate 5, carrier lifting plates 6 and claw opening and closing plates 45 rise from the positions shown in FIG. 6 to the positions shown in FIG. 7(a). As a result, the pins 27 are pushed outward by the tapered surfaces 45a of the claw opening and closing plates 45, so that the claw parts 25a of the claw levers 25 are released from the carrier 21 (with which they had been engaged). Afterward, the carrier 21 on the carrier lifting plates 6 pushes the disengaged carrier 21 upward. When the pins 27 are positioned at the grooves 45b, the claw parts 25a are positioned at the holes formed in the carrier 21 sitting on the carrier lifting plates 6. When the pins 27 are positioned at the grooves 45b as shown in FIG. 7(a), the claw levers 25 are closed inward by the driving force of the springs 29 as shown in FIG. 7(b). As a result, the claw parts 25a hold the carrier 21 positioned on the carrier lifting plates 6.

The carrier lifting support plate 5, carrier lifting plates 6 and claw opening and closing plates 45 are lowered as shown in FIG. 7(c). In this case, the pins 27 contact the tapered surfaces 45c of the grooves 45b, so that the claw opening and closing plates 45 are opened outward against the driving force of the springs 47. Afterward, when the pins 27 are released from the claw opening and closing plates 45, the claw opening and closing plates 45 are returned to their original positions by the driving force of the springs 47 as shown in FIG. 7(d). As a result of this action, the carrier 21 previously positioned on the carrier lifting plates 6 is held by the claw levers 25 and thus stored in the receiving device.

In the supplying device of the present invention, carriers 21 are extracted one at a time as follows: The carrier lifting plates 6 and claw opening and closing plates 8 rise together, so that the claw levers 25 are opened by the carrier lifting plates 6. As a result, the lowermost carrier 21 held by the claw levers 25 is placed on the carrier lifting plates 6. Afterward, when the carrier lifting plates 6 and claw opening and closing plates 8 are lowered, the next carrier 21 above the lowermost carrier 21 is held by the claw levers 25. Furthermore, in the receiving device of the present invention, carriers 21 are received in the following manner: The carrier lifting plates 6 on which a carrier 21 is positioned rise so that the claw levers 25 are opened by the claw opening and closing plates 45. When the carrier 21 on the carrier lifting plates 6 is positioned at the claw parts 25a of the claw levers 25, the claw levers 25 are closed so that the carrier 21 on the carrier lifting plates 6 is held by the claw levers 25. Afterward, the carrier lifting plates 6 and claw opening and closing plates 45 are lowered.

Accordingly, carriers 21 can be accommodated in a stacked arrangement in the area between the carrier guide plates 20, 23, 35 and 36, which thus form a magazine. Thus, in the present invention not only can a large number of carriers 21 be accommodated, there is an additional advantage in that even if there is a change in the height of the carriers 21, it only necessary to change the claw opening and closing plates 8 or the claw opening and closing plates 45.

Furthermore, in the above described embodiment, holes are formed in the side surfaces of the carriers 21, and the claw parts 25a of the claw levers 25 are caused to engage with these holes. However, it would also be possible to install projecting rims on the side surfaces of the carriers 21 and to cause the claw parts 25a to engage with the undersurfaces of these projecting rims.

As is clear from the above description, the present invention provides a supplying device and a receiving device which easily handles carriers of different heights and makes it possible to accommodate an extremely large number of carriers.

We claim:

1. A receiving device for inserting carriers carrying semi-conductor substrates into a magazine characterized in that said device comprises: carrier guide means which are installed facing each other across a gap which is slightly wider than the width of the carriers, the bottom of said gap being open; claw means which are installed facing each other and free to rotate on said carrier guide means, said claw means supporting the lowermost carrier accommodated inside said carrier means; a carrier lifting means which is driven vertically between said carrier guide means from a point below said carrier guide means; and a claw opening and closing means which is installed on said carrier lifting means and rises together with said carrier lifting means to open said claw means so that a specified carrier carried on said carrier lifting means is positioned inside the carrier guide means and then allows said claw means to close to support the carrier still carried on said carrier lifting means, said claw opening and closing means then lowering when said carrier lifting means is lowered; and wherein said claw opening and closing means is provided with a groove and a sloped top surface and said claw means is provided with a pin which engages said sloped top surface as said carrier lifting means rises to open said claw means and which then moves through said groove in said claw opening and closing means to close said claw means and hold said carrier while said carrier is still carried on said carrier lifting means.

* * * * *